United States Patent
Koike

(10) Patent No.: US 10,332,770 B2
(45) Date of Patent: Jun. 25, 2019

(54) WAFER TRANSFER SYSTEM

(71) Applicant: SANDISK TECHNOLOGIES LLC, Plano, TX (US)

(72) Inventor: Atsuyoshi Koike, Tokyo (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 142 days.

(21) Appl. No.: 14/671,414

(22) Filed: Mar. 27, 2015

(65) Prior Publication Data

US 2016/0111310 A1    Apr. 21, 2016

Related U.S. Application Data

(60) Provisional application No. 62/066,078, filed on Oct. 20, 2014, provisional application No. 62/054,639, filed on Sep. 24, 2014.

(51) Int. Cl.
*H01L 21/677* (2006.01)
*B65G 51/03* (2006.01)

(52) U.S. Cl.
CPC ........ *H01L 21/67784* (2013.01); *B65G 51/03* (2013.01); *H01L 21/6773* (2013.01); *H01L 21/67733* (2013.01); *H01L 21/67736* (2013.01)

(58) Field of Classification Search
CPC ......... H01L 21/67784; H01L 21/67196; H01L 21/67733; H01L 21/67751; B65G 51/03
USPC ........................................................ 414/676
See application file for complete search history.

(56) References Cited

U.S. PATENT DOCUMENTS

| | | | | |
|---|---|---|---|---|
| 3,588,176 A | * | 6/1971 | Byrne | H01L 21/67784 406/84 |
| 3,948,564 A | * | 4/1976 | Flint | H01L 21/67784 193/31 R |
| 3,976,329 A | * | 8/1976 | Adams | H01L 21/67784 193/40 |
| 3,976,330 A | * | 8/1976 | Babinski | H01L 21/67784 406/84 |
| T966,009 I4 | * | 1/1978 | Gardineer, Jr. | H01L 21/67784 361/215 |
| 4,123,113 A | * | 10/1978 | Koss | B65G 49/065 406/88 |
| 4,575,408 A | * | 3/1986 | Bok | B65G 51/03 118/50.1 |
| 4,618,292 A | * | 10/1986 | Judge | B65G 51/03 198/394 |

(Continued)

FOREIGN PATENT DOCUMENTS

| EP | 2031651 A2 | 3/2009 |
|---|---|---|
| EP | 2447193 A1 | 5/2012 |

(Continued)

*Primary Examiner* — James Keenan
(74) *Attorney, Agent, or Firm* — Vierra Magen Marcus LLP

(57) ABSTRACT

A wafer transport system includes a pod that contains one or more wafers in an enclosed environment, a substrate transport surface that extends substantially along a plane, intersecting at least first and second loading/unloading locations, and a pod controller that is configured to control movement of the pod by selecting a pathway from a plurality of available pathways extending along the substrate transport surface from the first loading/unloading location to the second loading/unloading location.

20 Claims, 12 Drawing Sheets

(56) References Cited

U.S. PATENT DOCUMENTS

| | | | | |
|---|---|---|---|---|
| 4,663,197 A * | 5/1987 | Bok | ...................... | B05C 5/0254 |
| | | | | 118/314 |
| 4,690,591 A * | 9/1987 | Nagashima | ............ | B65G 51/02 |
| | | | | 34/236 |
| 5,953,591 A * | 9/1999 | Ishihara | ................ | G03F 7/7075 |
| | | | | 29/25.01 |
| 6,285,102 B1 * | 9/2001 | Matsuoka | ............. | F16C 29/025 |
| | | | | 310/12.06 |
| 6,336,775 B1 * | 1/2002 | Morita | ................. | B65G 49/065 |
| | | | | 198/721 |
| 7,905,195 B2 * | 3/2011 | Yamasaki | ......... | H01L 21/67784 |
| | | | | 118/300 |
| 7,988,399 B2 * | 8/2011 | van der Meulen | .......................... | |
| | | | | H01L 21/67161 |
| | | | | 414/217 |
| 8,137,046 B2 * | 3/2012 | Kishimoto | ........ | H01L 21/67748 |
| | | | | 406/88 |
| 8,403,601 B2 * | 3/2013 | Yano | ................. | H01L 21/67017 |
| | | | | 406/155 |
| 8,985,911 B2 * | 3/2015 | He | .................... | C23C 16/45565 |
| | | | | 108/50.13 |
| 9,862,554 B2 * | 1/2018 | Caveney | ........... | H01L 21/67173 |
| 2006/0045667 A1 * | 3/2006 | Savas | ................ | H01L 21/67173 |
| | | | | 414/217 |
| 2007/0181735 A1 * | 8/2007 | Fedorov | ................ | B65G 51/03 |
| | | | | 242/541.7 |
| 2010/0202861 A1 | 8/2010 | Sawado et al. | | |
| 2011/0222994 A1 | 9/2011 | Inagaki et al. | | |
| 2012/0093620 A1 | 4/2012 | Murato et al. | | |
| 2013/0055954 A1 | 3/2013 | Yoo | | |
| 2013/0199448 A1 * | 8/2013 | Granneman | ........... | B65G 51/03 |
| | | | | 118/729 |
| 2014/0341681 A1 | 11/2014 | Inagaki et al. | | |

FOREIGN PATENT DOCUMENTS

| | | | | |
|---|---|---|---|---|
| EP | | 2615625 A1 | 7/2013 | |
| EP | | 2790210 A2 | 10/2014 | |
| JP | | 2010-050458 | 3/2010 | |
| JP | | 2010-212648 A | 9/2010 | |
| JP | | 2011-006222 | 1/2011 | |
| JP | | 2013-102235 | 2/2013 | |
| JP | | 2013-157650 | 8/2013 | |
| JP | | 2014-093489 | 5/2014 | |
| WO | WO 87/04853 A1 * | 8/1987 | ....... | H01L 21/67784 |

\* cited by examiner

WAFER TRANSFER SYSTEM

This application claims the benefit of U.S. Provisional Patent Application No. 62/066,078, which was filed on Oct. 20, 2014 and U.S. Provisional Patent Application No. 62/054,639, which was filed on Sep. 24, 2014, which are hereby incorporated by reference in their entirety.

BACKGROUND

The present application relates to transport of substrates such as silicon wafers within a facility that includes multiple substrate processing tools.

Processing of semiconductor substrates (wafers) such as silicon wafers is used to fabricate a variety of integrated circuits (ICs) in what may be referred to as a "fab." Fabs are extremely expensive to build and operate. Special equipment may be required to maintain a clean room environment (e.g. special air-handling to reduce the number of airborne particles). Reducing the area of a fab reduces construction cost and operating cost. In some cases, a fab has a main floor where processing tools are arranged with space for personnel access around each tool (e.g. for maintenance) and a wafer loading area in front of each tool. Passageways for personnel and wafer transport may take significant space within a fab.

A semiconductor device manufacturing line may include multiple semiconductor substrate processing tools that perform various processes, such as film deposition like sputtering and CVD (Chemical Vapor Deposition), exposure, etching, rinsing, and CMP (Chemical Mechanical Polishing) on semiconductor substrates (wafers). A substrate transport system may carry the wafers between semiconductor processing tools in an enclosure such as a FOUP (Front-Opening Unified Pod) or other substrate transport pod.

In a current FOUP transfer system, a load port of a FOUP is provided at a front part of a semiconductor processing tool (e.g. a tool such as a cluster tool), at about the same height as a worker's waist. This is because the transfer interface is designed ergonomically for human-centered operation (i.e. the height of the load port is designed to allow manual loading and or manual assistance or maintenance of the load port). A load port may be an assembly that provides a clean environment for opening FOUPs and for transfer of the substrates in the FOUP to the semiconductor processing equipment. Various mechanical components of the load port may facilitate handling of the FOUP and the substrates.

The following problems may occur when a FOUP transfer is carried out by using the FOUP transfer system as described above.

(1) The FOUP has to be transferred for a few meters (see pathway A1 in FIG. 1) from a ceiling transfer rail to the load port placed at the front part of the semiconductor processing equipment. Due to this, the transfer mechanism to transfer the wafers from the overhead rail to the process chamber may be large, complicated, expensive, and transfer time may be long.

(2) Significant space is generally dedicated for the load port at the front of the equipment (see region R0) which may be wasteful of valuable clean room space (i.e. the load port may have a significant footprint in addition to the footprint of the semiconductor processing equipment). Because each piece of semiconductor processing equipment may require one or more such load port (e.g. two or more load ports to provide a constant supply of wafers throughout FOUP transfers), the aggregated footprints of such equipment may represent a significant area and thus may represent a significant cost.

(3) Movement of FOUPs along rails means that if the rail become blocked (e.g. a FOUP becomes jammed, some other object obstructs the rails, or rails become deformed, then delivery of FOUPs stops until human intervention unblocks the rail).

(4) Significant space may be dedicated to providing personnel access around semiconductor substrate processing tools to allow human operation, loading, and maintenance to be carried out. This is in addition to space required for FOUP loaders.

SUMMARY

An example of a wafer transport system includes a wafer transport surface that extends over an equipment level in which wafer processing tools are located. Wafers move horizontally along the wafer transport surface between loading/unloading locations where tool load ports are located. Wafers can then move vertically between the loading/unloading locations and the interior of processing tools. Wafers may move along the wafer transport surface in self-propelled pods that are controlled so that each pod can navigate around obstacles, including other pods, and choose an appropriate pathway to its destination. A destination may be selected according to tool availability. Thus, rather than following a predetermined route from tool to tool, a wafer may be rerouted dynamically according to tool availability and pathways between tools may be selected to provide efficient traffic flow. Tools may be aligned with the wafer transport surface so that load ports are flush, or uniformly aligned with the wafer transport surface. Tools may be raised up from a floor to achieve alignment. Different tools may be raised to different heights. A personnel access level may extend under such tools to allow access from below (e.g. for maintenance). Tools may be lowered from the equipment level to the personnel access level in some cases to allow better access. An alternative wafer transport system does not require pods. Instead, wafers are suspended on gas jets (e.g. inert gas such as nitrogen) in a conduit that may extend over or under processing tools.

An example of a semiconductor substrate transport system includes: a substrate transport pod that contains one or more substrates in an enclosed environment; a substrate transport surface that extends substantially along a plane, the plane intersecting at least a first loading/unloading location and a second loading/unloading location; and a substrate transport pod controller that is configured to control movement of the substrate transport pod along the substrate transport surface from the first loading/unloading location to the second loading/unloading location by selecting a pathway from a plurality of available pathways extending along the substrate transport surface from the first loading/unloading location to the second loading/unloading location.

The substrate transport pod controller may be configured to select the pathway based on locations of one or more obstructions located along one or more of the available pathways. The one or more obstructions may include one or more additional substrate transport pods. The substrate transport pod may be self-propelled and may have freedom to move laterally along the substrate transport surface in two dimensions. The substrate transport pod controller may be further configured to control movement of a plurality of additional substrate transport pods along the substrate transport surface, to and from a plurality of additional loading/ unloading locations at the same time, individual pathways chosen for individual additional substrate transport pods according to current and/or predicted locations of the substrate transport pod and the additional substrate transport pods. The substrate transport pod may be supported on a plurality of wheels located on the bottom of the substrate transport pod, the substrate transport surface may be substantially flat, and the plurality of wheels may contact the substrate transport surface without rails or other lateral constraints. The plane of the substrate transport surface may extend above a plurality of semiconductor substrate processing tools including at least a first semiconductor substrate processing tool that is located directly under the first loading/unloading location and a second semiconductor substrate processing tool that is located directly under the second loading/unloading location. The plurality of semiconductor substrate processing tools may be located in an equipment level when in use, the equipment level extending over a personnel access level that provides access to the plurality of semiconductor processing tools from below, the plurality of semiconductor processing tools each having a corresponding loading/unloading location along the plane. The plane of the substrate transport surface may extend below a plurality of semiconductor substrate processing tools including at least a first semiconductor substrate processing tool that is located directly above the first loading/unloading location and a second semiconductor substrate processing tool that is located directly above the second loading/unloading location. The plurality of semiconductor substrate processing tools may be located in an equipment level when in use, the equipment level extending under a personnel access level that provides access to the plurality of semiconductor substrate processing tools from above.

An example of a semiconductor substrate transport system includes: a substrate transport conduit that extends along a horizontal plane between a first load/unload location for a first semiconductor processing tool and a second load/unload location for a second semiconductor processing tool, the substrate transport conduit having a conduit floor; and a gas delivery system that forms a plurality of jets of gas extending up from the conduit floor, the plurality of jets configured to provide an upward force on a semiconductor substrate within the conduit that is equal to the weight of the semiconductor substrate and thereby float the semiconductor substrate above the conduit floor without physically contacting the conduit floor.

The gas delivery system may form the plurality of jets of gas from an inert gas that is supplied at a pressure substantially above atmospheric pressure. The substrate conduit may be substantially enclosed so that an interior space within the conduit is isolated from ambient air and contamination. A vacuum valve may selectively connect the interior space, or a portion of the interior space, to a vacuum source to thereby selectively create a vacuum within the substrate transport conduit. The vacuum valve may connect a portion of the interior space at the first load/unload location to the vacuum source to selectively form a vacuum at the first load/unload location during loading and unloading of a semiconductor substrate.

An example of a method of transporting semiconductor substrates includes: processing semiconductor substrates in a plurality of semiconductor processing tools located in a semiconductor processing level of a semiconductor fabrication facility; and transporting semiconductor substrates laterally from tool to tool in a transportation level of a semiconductor fabrication facility that is vertically offset from the semiconductor processing level, the semiconductor substrates transported directly from tool to tool along routes that are selected according to tool availability and locations of obstructions in the transportation level.

The transportation level may extend above the processing level, the semiconductor substrates may be transported laterally from tool to tool in self-propelled pods on wheels, and the method may further include: removing the semiconductor substrates from the self-propelled pods at load/unload locations over tools; and subsequently, transporting the semiconductor substrates without the self-propelled pods downwards from the transportation level into an individual tool through a load/unload port located directly over the tool. Transporting semiconductor substrates laterally may include supporting semiconductor substrates on jets of gas that are directed at lower surfaces of the semiconductor substrates so that semiconductor substrates are transported directly from tool to tool without physical contact with any solid object. Loading an individual substrate into a semiconductor processing tool may include: enclosing the individual substrate in an enclosure formed within the transportation level; evacuating the enclosure by connecting the interior of the enclosure to a vacuum source; and subsequently, after the enclosure reaches a predetermined level of vacuum, opening the enclosure to an interior portion of the semiconductor processing tool that is maintained at or near the predetermined level of vacuum. The selecting according to tool availability and locations of obstructions may include selecting the next available tool from a group of tools that perform a common process and selecting a route to the next available tool that detours around one or more movable obstructions. The transportation level may extend above the processing level, the semiconductor substrates may be transported laterally from tool to tool in self-propelled pods on wheels, and the method may include: stopping a self-propelled pod at a loading/unloading location in the transportation level; subsequently opening the self-propelled pod by lowering a bottom portion of the self-propelled pod; and subsequently loading semiconductor substrates from the self-propelled pod into a tool by lowering the bottom portion of the self-propelled pod with the semiconductor substrates from the transportation level to the semiconductor processing level while an upper portion of the self-propelled pod remains at the loading/unloading location in the transportation level.

Various aspects, advantages, features and embodiments are included in the following description of examples, which description should be taken in conjunction with the accompanying drawings.

DESCRIPTION

Figure 1:
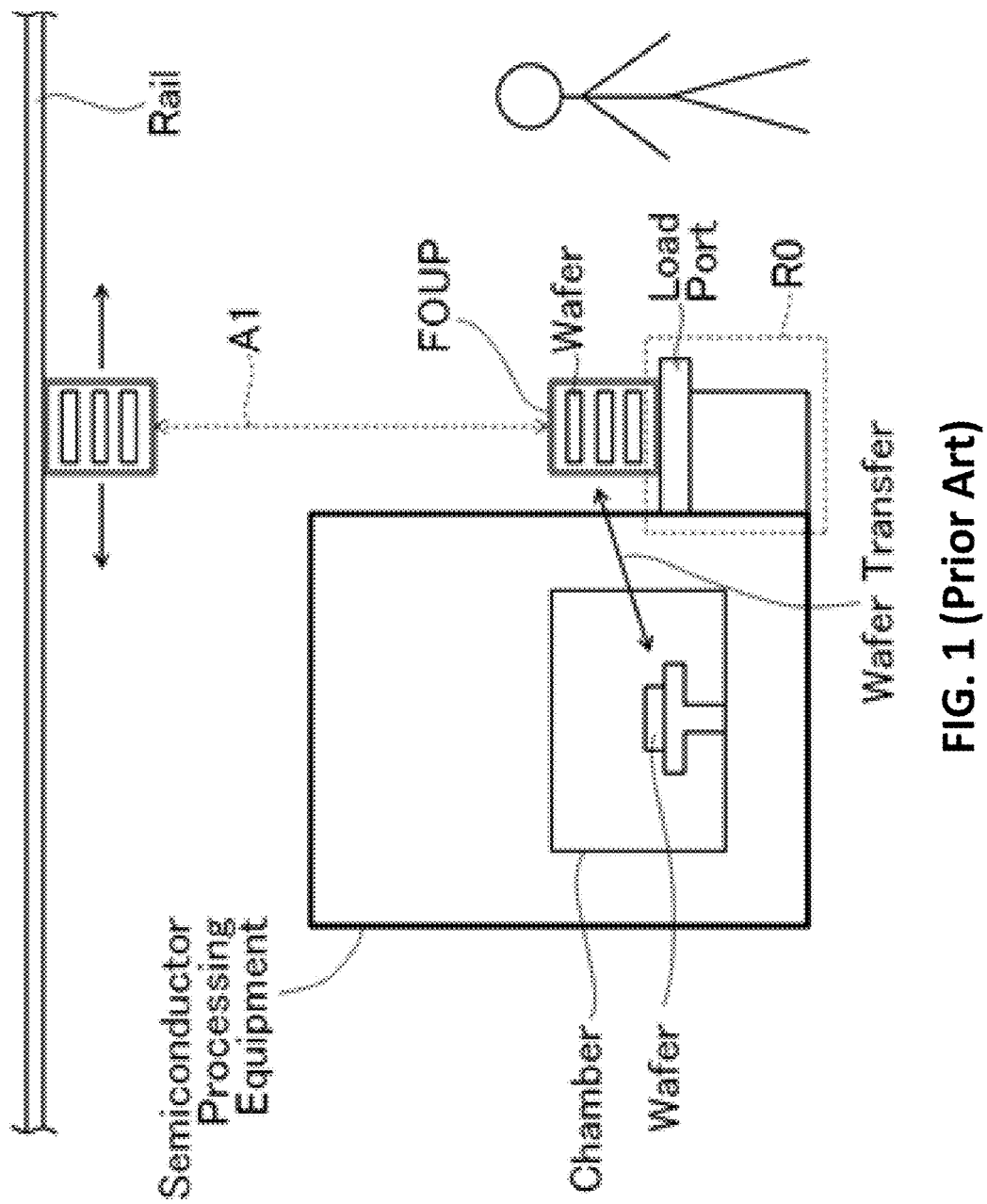
FIG. 1 shows an example of prior art wafer transport.

Various substrates may be transported in a factory, production facility, or fab. Examples include silicon wafers, other semiconductor wafers (e.g. GaAs), flat panel display substrates, and solar panels. Silicon wafers are used to produce a variety of ICs including logic ICs such as controllers, communication devices, programmable logic devices, sensors, and memory devices.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Aspects of the techniques described below may be applied to any appropriate substrates in any appropriate facility. For example, memory ICs such as NAND flash memory ICs and 3D memory ICs may be produced in high-volume facilities where operating costs are high and efficiency is important. Various techniques described here may reduce initial cost, reduce operating cost, increase wafer transport speed, and improve yield (e.g. through lower particle count).

1. Top-Down Transfer

Figure 2:
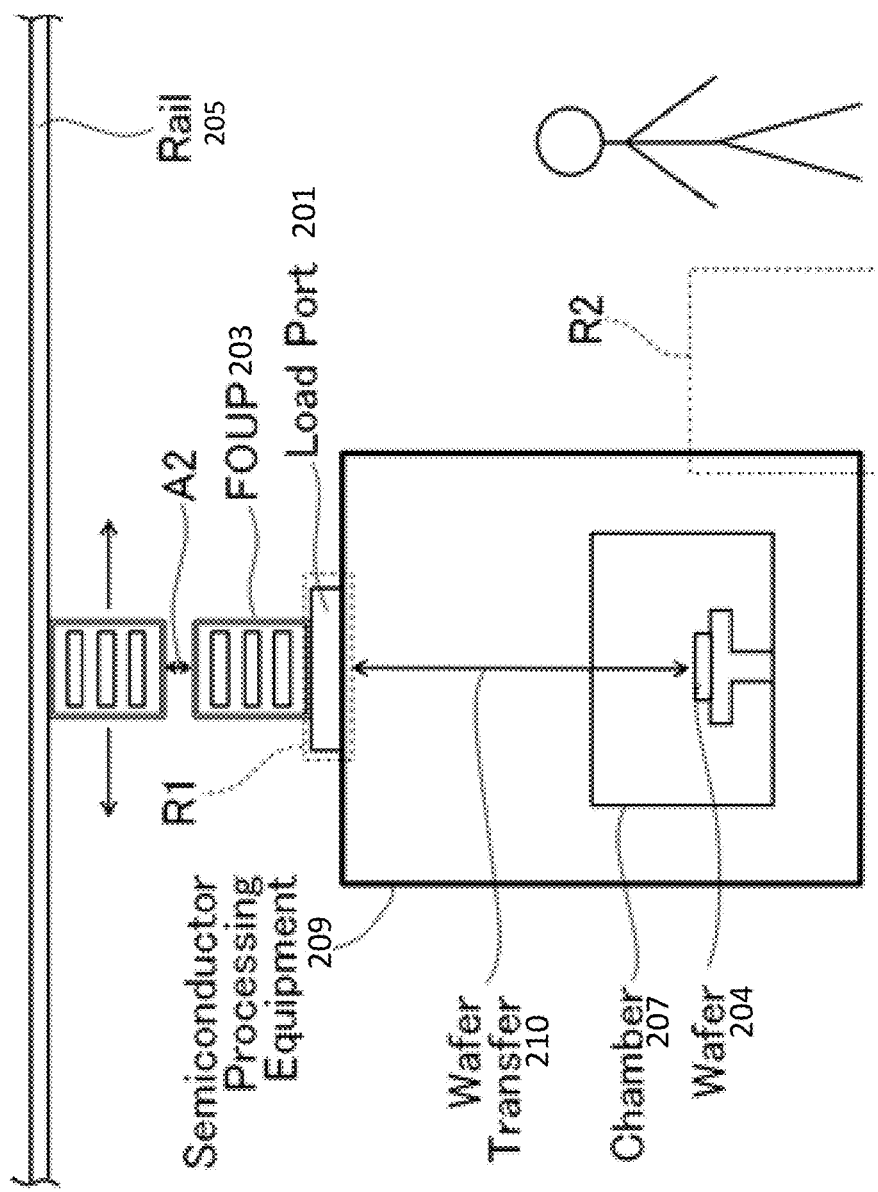
FIG. 2 shows an example of vertical transfer from a wafer transport system to a tool.

The equipment interface for transfer (Load Port 201) shown in FIG. 2 is designed 'robotically' instead of 'ergonomically', to be suitable for the transfer system while omitting the known human-centered design. A FOUP 203 or other substrate transport pod is transferred on a ceiling rail 205. Load port 201 of the semiconductor processing equipment is placed at the top portion thereof (see region R1). For example, a load port may be on an upper surface of a process chamber or a larger assembly that includes the process chamber and may include a load lock, transfer chamber and/or additional components. A load port may be integrated with the semiconductor processing equipment or may be a separate assembly that sits on, or is externally attached to the semiconductor processing equipment. Transfer of a wafer 204 from the plane of rail 205 to the chamber 207 (i.e. to processing level) following a substantially vertical pathway (FOUP pathway A2 and waver transfer pathway 210) instead of along a partially vertical and partially horizontal pathway as in FIG. 1.

The arrangement of FIG. 2 provides various advantages over the arrangement of FIG. 1 including the following:

(1) The FOUP 203 is transferred only for a short distance from the ceiling rail to the load port (see pathway A2 which is significantly shorter than pathway A1 of FIG. 1). Because the distance is shorter, the transfer mechanism can be simplified, and the transfer time can be shortened.

(2) The space for placing the load port, which was conventionally at the front part of the semiconductor processing equipment, is no longer necessary (see region R2). Load port hardware may be mounted over the semiconductor processing equipment 209 where it does not add to overall footprint. Such stacking of transfer equipment, loading equipment, and processing equipment uses valuable space in an efficient manner. Footprint can be reduced significantly by relocating such load ports. For example, in a facility with many pieces of equipment, each having one or more such load port, the overall saving in footprint may be substantial.

Furthermore, when there is a transition from one standard to another (e.g. a transition from one wafer size to a larger wafer size such as when the wafer size is switched from 300 mm to 450 mm in the future) semiconductor processing equipment and the transfer system may be substantially reconfigured and new equipment standards may emerge. The arrangement shown in FIG. 2 may be implemented as part of such a transition to a new standard, or new set of standards (implementation may also be separate from such a transition). Thus, the arrangement of FIG. 2 may provide a basis for a technical standard of a transfer system for the 450 mm generation.

2. Directly Connected Load Port

Figure 3A:
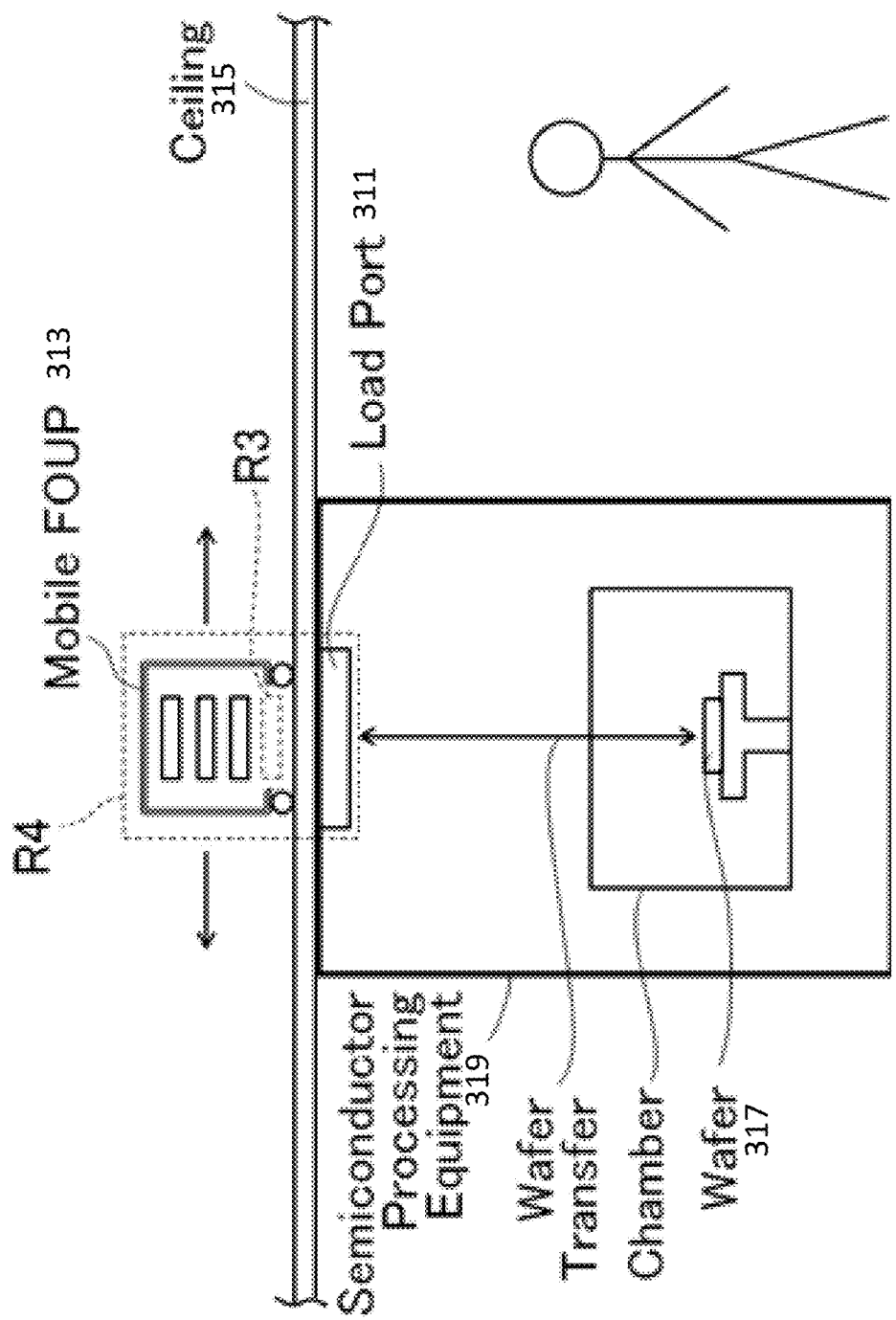
FIG. 3A shows an example of a loading/unloading location along a wafer transport surface.
Figure 3B:
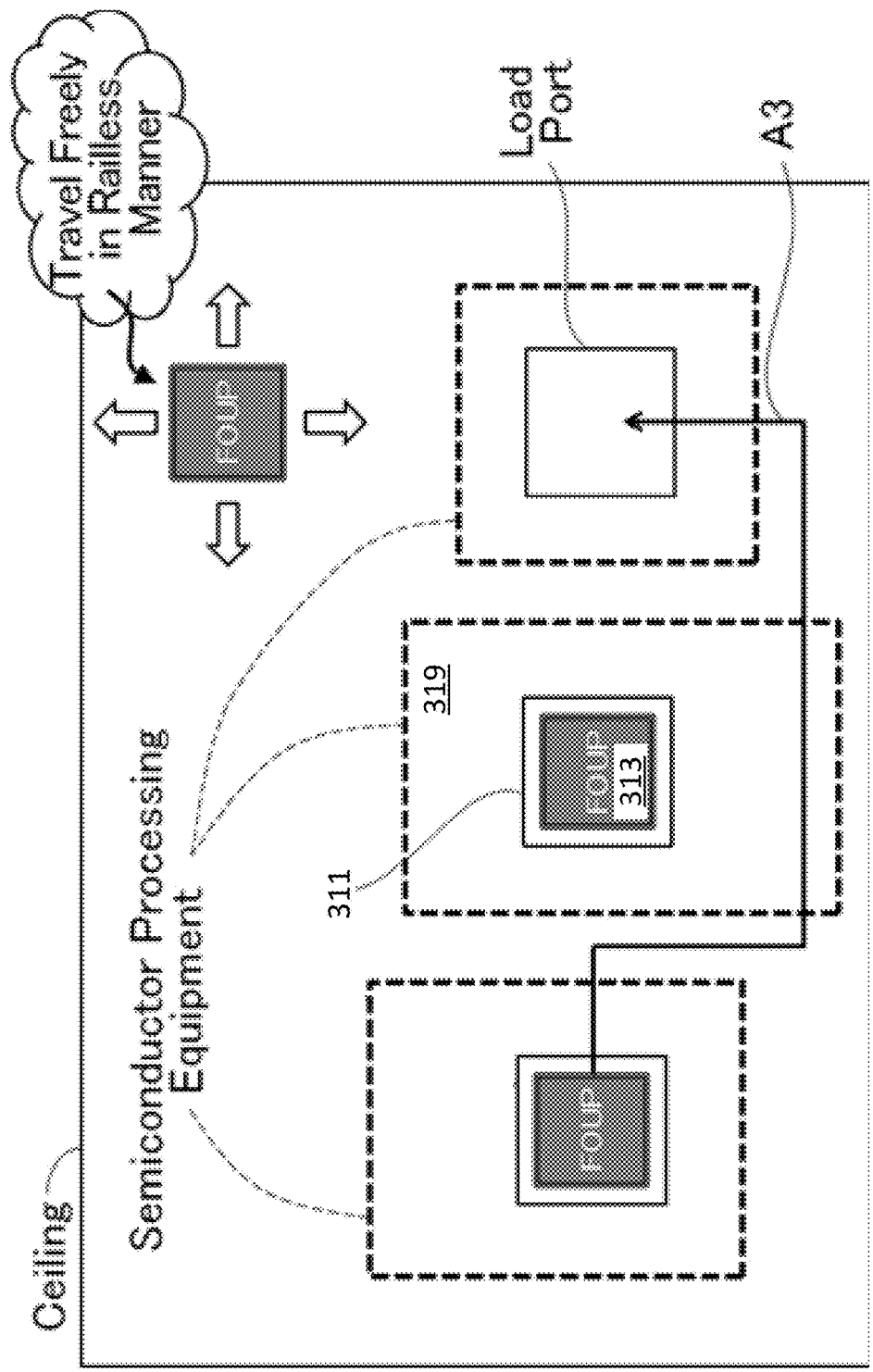
FIG. 3B shows an plan view of a wafer transport surface.
Figure 3C:
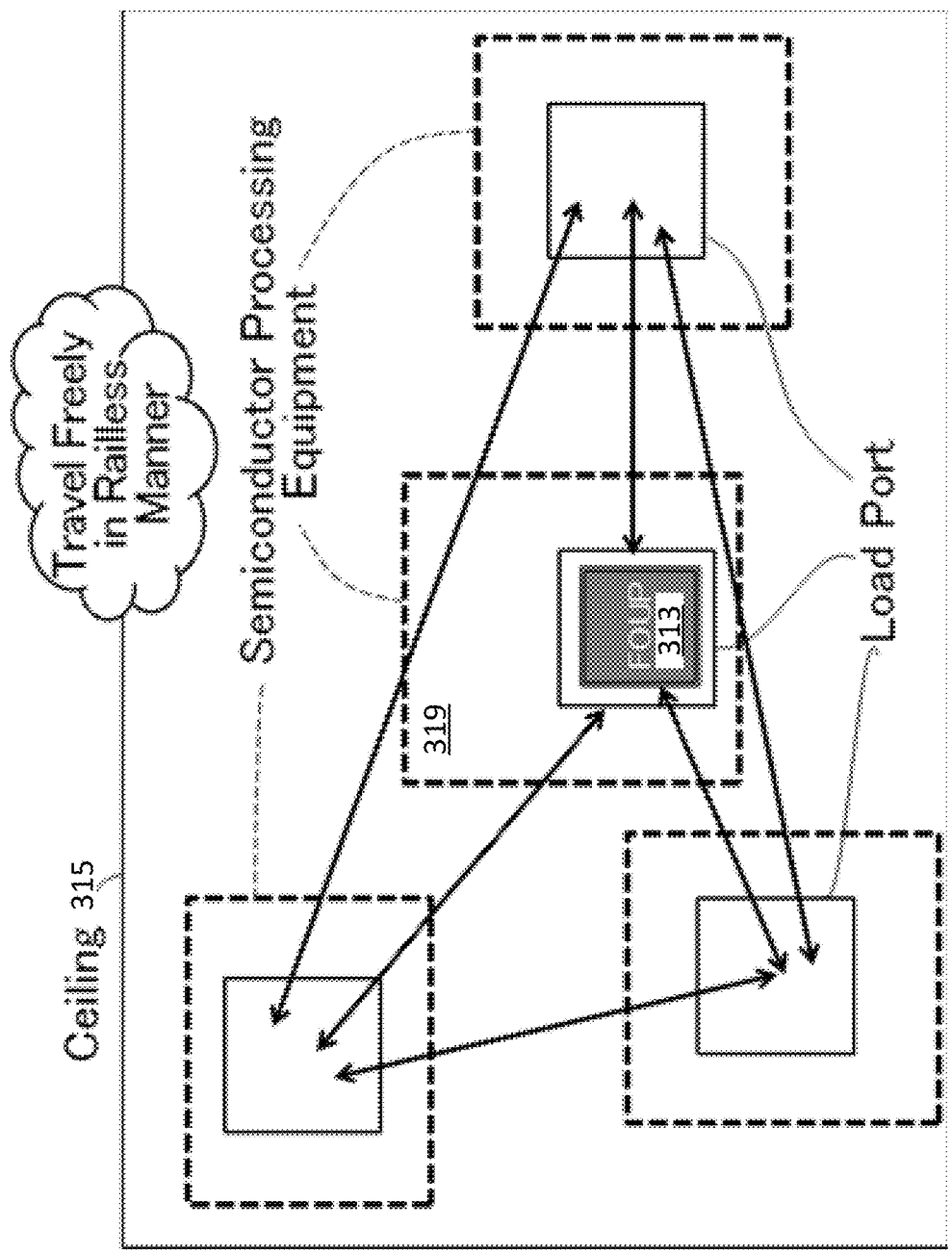
FIG. 3C shows an example of multiple pathways along a wafer transport surface.

The load port 311 of FIGS. 3A-3C is placed on a transfer passage such as a rail or rail-less track for mobile FOUP or substrate transport pod transfer (the illustrated example shows rail-less transfer). The FOUP 313 may interface with the load port 311 by the FOUP simply stopping at a loading/unloading location above a load port (i.e. there is no additional transfer of the FOUP down to the load port corresponding to A1 and A2 of FIGS. 1 and 2 respectively).

While the term "FOUP" is used here as a well-known substrate transport pod design, the example of FIGS. 3A-3C and other examples described here are not limited to a standardized FOUP or any other pod standard. For example, rather than a Front-Opening FOUP, a bottom-opening pod may be used in FIGS. 3A-C so that one or more substrates may be lowered directly from the pod into the load port (while the pod, or a portion of the pod, remains stationary in the transfer passage). Other examples may use side-opening, top-opening, or other types of pods. The pod may be a Standard Mechanical Interface (SMIF) pod or some other standardized pod, or custom pod, and is not limited to any particular opening orientation or hardware. While the term "FOUP" is used in many examples it will be understood that any suitable pod may be similarly used. Similarly, various examples here are described with respect to a silicon wafer or other specific substrate. However, various examples are applicable to a range of different substrates (e.g. flat panel displays, solar panels, etc.) and are not limited to silicon wafers.

A transfer space, or transfer passage, is arranged on the ceiling 315 in FIG. 3A. The ceiling forms a substantially flat substrate transfer surface in this example. A mobile FOUP 313 (e.g., wheeled and self-propelled FOUP or other pod) is made to travel in a self-propelled rail-less manner in the transfer space. An opening for loading/unloading a wafer 317 may be provided at a loading/unloading location R4 where the bottom part of the FOUP (region R3) may align with the opening. In this configuration, the mobile FOUP 313 interfaces (docks) with the load port 311 when mobile FOUP 313 stops at the loading/unloading location (R4) at the top part of the semiconductor processing equipment 319. In some cases, the interior of a FOUP may be maintained below atmospheric pressure (partial vacuum) and docking may open the interior of the FOUP with the interior of a processing tool that is similarly below atmospheric pressure.

Other mobile FOUPs can move by avoiding the mobile FOUP 313 parked on the load port 311 since the mobile FOUPs move in a rail-less manner as shown in top-down view in FIGS. 3B and 3C. For example, the ceiling may provide a substantially unobstructed plane (substantially planar surface) above a semiconductor fabrication facility ("fab"), i.e. above the semiconductor processing equipment, where mobile self-propelled pods may move around freely without constraints (unlike rail based transport). The ceiling is not necessarily the top level in the facility (there may be additional air-handling or other equipment at one or more higher levels). In some cases, air handling or other equipment is located on the ceiling shown so that the mobile pods navigate available areas while avoiding areas occupied by equipment and avoiding other pods (whether stationary or moving). A system of lanes may be provided for movement of mobile pods with load ports located along lanes, or adjacent to lanes, to provide docking locations (loading/unloading locations) for pick-up and drop-off. While this may provide some constraints on FOUP movement (i.e. FOUP movement is not completely free in this example), it is less constrained than rail-based transport. For example, lanes may be reconfigured without requiring physical modification of rails in a confined space.

FIG. 3B illustrates how a FOUP may travel along around a stationary FOUP 311 to move from one load port to another port (pathway A3). Such a pathway may follow a predetermined lane or may be identified as needed based on parameters such as the shortest path to a destination and the locations of obstacles (e.g. other FOUPS) along the way. A default pathway may lead from tool to tool from left to right in FIG. 3B. However, because FOUP 313 is coupled to the load port 311 of tool 319, pathway A3 is used to bypass the occupied load port 311. Alternative pathways may also lead along alternate routes between tools. In general, between any two loading/unloading locations, there are many possible pathways and an appropriate pathway may be chosen depending on circumstances. A pod controller may control all pods on the wafer transport surface to coordinate movement of pods. Thus, a central controller may perform traffic control operations that ensure that self-propelled pods do not collide and that traffic moves freely throughout the wafer transport surface. Alternatively, some or all control may be maintained by individual pods so that pods are largely autonomous. Such pods may be assigned a destination by a central controller and may then determine an appropriate pathway, making adjustment as they encounter obstructions or traffic.

FIG. 3C shows various load port locations (loading/unloading locations) on a wafer transport surface (ceiling 315) above semiconductor equipment 319. Various pathways are possible between equipment. Unlike rail-based transport which is generally limited to a particular sequence of processing (e.g. a linear arrangement where FOUPs travel from one machine to a neighboring machine in conveyor belt fashion) this arrangement is more flexible and allows various process flows to be accommodated without physical reconfiguration or manual intervention. This may allow more flexibility and more efficient use of processing equipment. For example, if a substrate or substrates in a FOUP are ready to be processed in a neighboring process tool, but the tool is busy or unavailable because of maintenance, the FOUP may simply be rerouted to a different tool (even if it is some distance away). Thus, instead of following a predetermined pathway through a fab, from tool A, to tool B, to tool C . . . and so on, a FOUP may start in tool A and then go to the next available tool that can perform the next process steps. For example, if the next step is a wafer cleaning step, the FOUP may go to the next available cleaning station (not tool B) instead of following a predetermined path which might mean waiting for a specific wafer cleaning station to be available.

An advantage of such unconstrained movement of pods is that an integrated manufacturing line with redundancy can be constructed. Conventional manufacturing lines generally move substrates along a predetermined pathway from tool-to-tool, e.g. along a line from tool A to B to C, and so on, If one tool along the line stops, or operates slowly, then the entire line stops, or operates slowly. The line generally operates at the speed of the slowest tool in the line. In a more flexible arrangement, such as illustrated in FIGS. 3B and 3C, if a particular tool is stopped or operates slowly the manufacturing facility adapts to this condition by rerouting substrates as needed. For example, if tool B is stopped or slowed, then the pathway for substrates may use tool B' (a similar tool to tool B) instead. Such rerouting does not require major hardware changes such as modifying or replacing rails.

Figure 4:
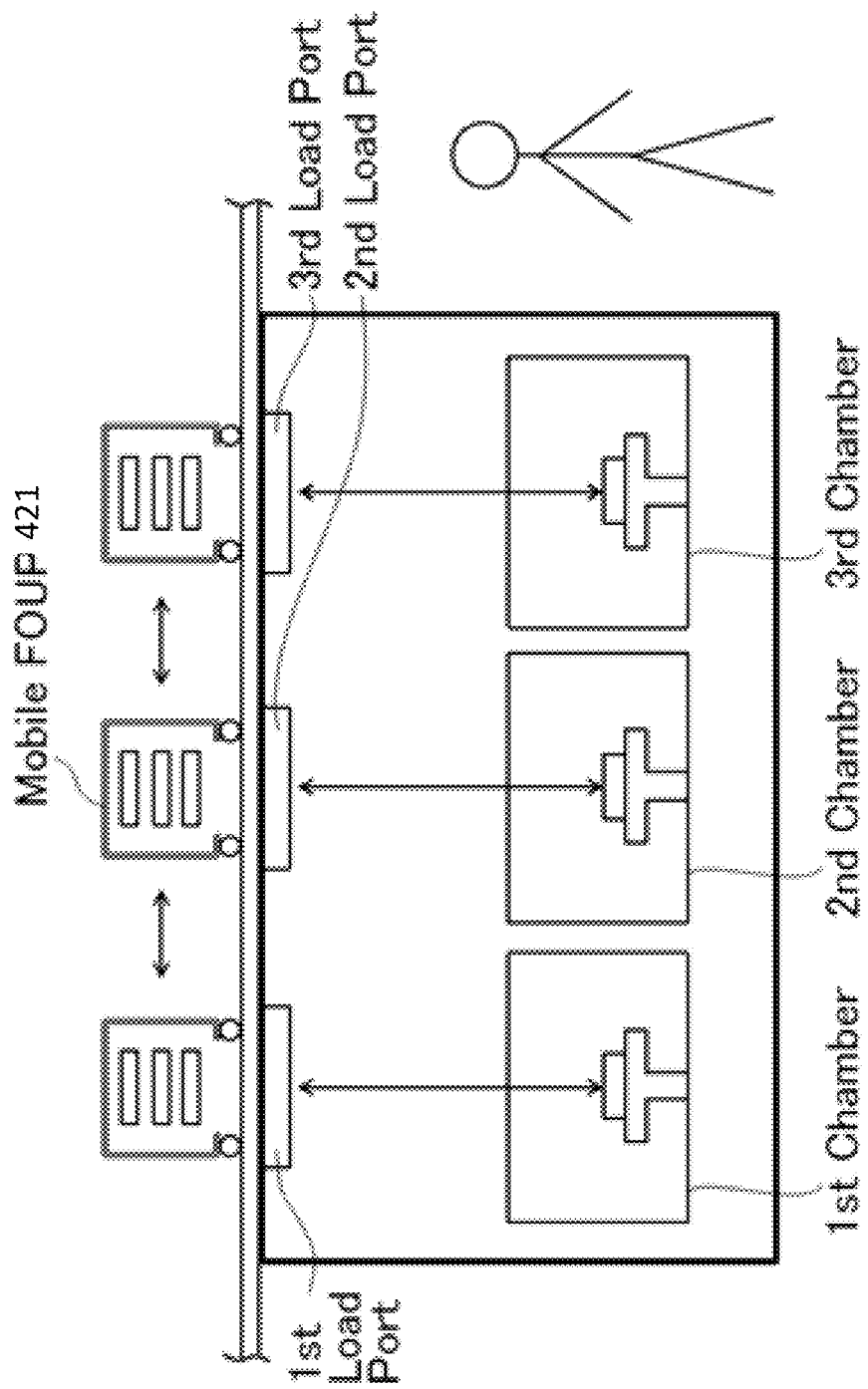
FIG. 4 shows an example of chambers arranged in series.

As illustrated in FIG. 4, aspects of the present technology can be adapted to multiple chambers. The semiconductor processing equipment is provided with 1st to 3rd chambers and corresponding 1st to 3rd load ports. A mobile FOUP 421 moves among the 1st to 3rd loading/unloading locations of $1^{st}$ to $3^{rd}$ load ports. Wafers in the mobile FOUP can be processed in parallel in the 1st to 3rd chambers.

Figure 5:
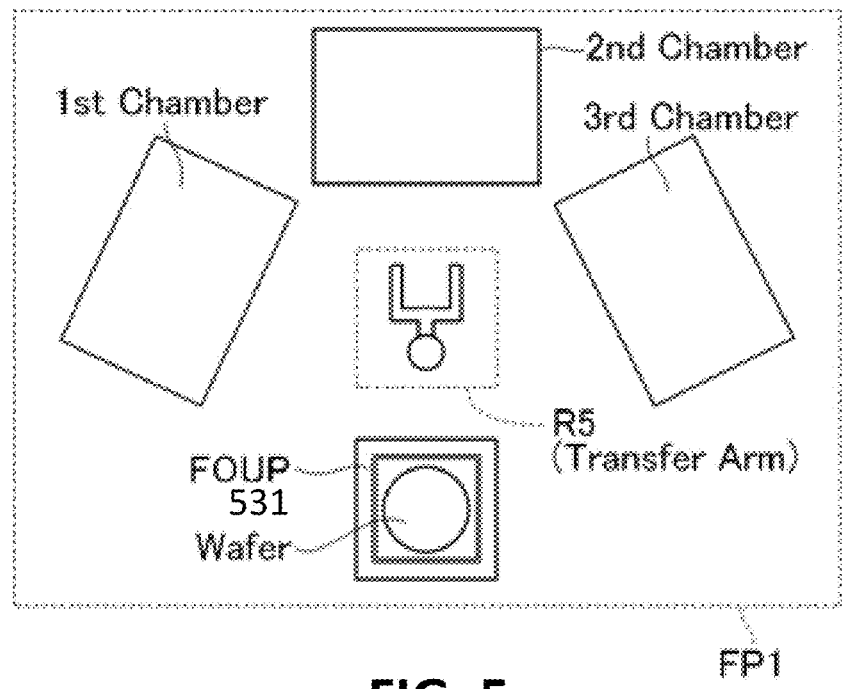
FIG. 5 shows an example of chambers loaded and unloaded by a transfer arm.

FIG. 5 shows a top view of a piece of semiconductor processing equipment with footprint FP1 adapted to multiple chambers ($1^{st}$-$3^{rd}$ chambers) e.g. cluster tool or similar arrangement of chambers or processing stations. The 1st to 3rd chambers are arranged around a transfer arm (region R5) that performs transfers of wafers to and from the chambers and FOUP 531. A significant space is occupied by the transfer area (e.g. transfer chamber containing a transfer arm). The footprint FP1 may be significant because of the arrangement of chambers. In particular, $1^{st}$-3rd chambers are arranged along a horizontal plane at a fixed distance from the center of the transfer robot so that the transfer arm can extend to load and unload from each chamber. The distance is sufficient to allow the robot arm to rotate and extend and to allow each chamber to be accessed.

Figure 6:
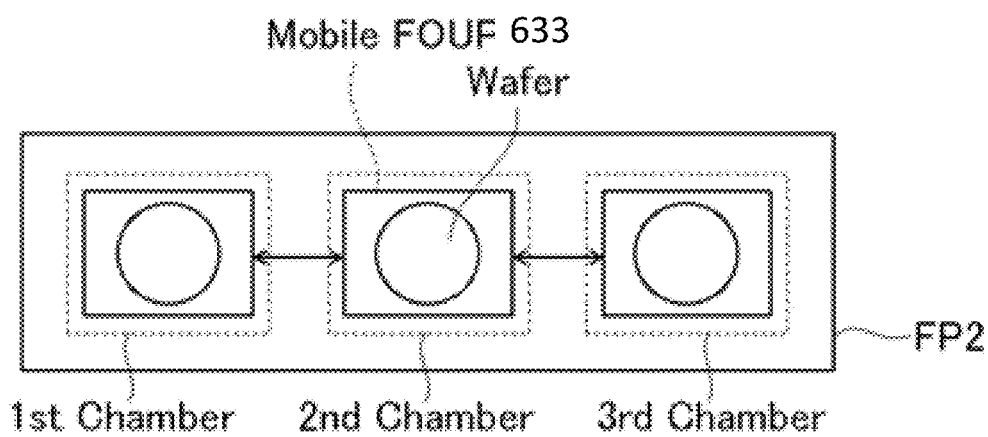
FIG. 6 shows an example of chambers without a transfer arm.

In contrast, FIG. 6 shows a top view of semiconductor processing equipment with footprint FP2 that does not require such a central transfer area. The mobile FOUP 633 can substitute for the transfer arm by providing chamber-to-chamber transport for substrates. Horizontal transport may be provided by mobile FOUPs with transfer of wafers from FOUPS to processing chambers being only in the vertical (or substantially vertical) direction. The chambers therefore can be aligned in a straight line (or other closely-packed arrangement) and may be closely spaced. The footprint FP2 of the semiconductor processing equipment can be reduced since flexibility of the chamber arrangements can be increased. For example, the geometric arrangement of the rectangular chambers shown may more efficiently use space. In some cases, chambers may be located with little or no space between chambers and with little or no additional footprint for transfer equipment such as a transfer arm.

The arrangement of FIG. 6 has various advantages including:

(1) FOUP transfer from the transfer passage to the load port can be omitted (the transfer passage meets the load port for direct loading, e.g. load port may be flush with ceiling).

(2) In a multi-chamber arrangement, the flexibility of the chamber arrangements can be increased. The footprint of the semiconductor processing equipment can be reduced by a more compact arrangement of chambers and the transfer area may be reduced or eliminated.

In the conventional multiple chambers in FIG. 5, the number of the chambers is limited to some maximum number according to chamber size and robot configuration, and there is no flexibility that would allow more than the maximum number (e.g. a transfer chamber may have a fixed number of positions for attaching chambers). Efficiency may drop in cases with very long or short processing time. In contrast, in the examples of FIGS. 4 and 6, the maximum number of the chambers that can be operated together in series is unlimited. Although three chambers are shown in FIGS. 4 and 6, there may be two, four, or more chambers. The number of chambers by which the efficiency can be maximized can be selected in accordance with the processing time. This configuration provides greater flexibility.

3. Three-Layer Facility

Figure 7:
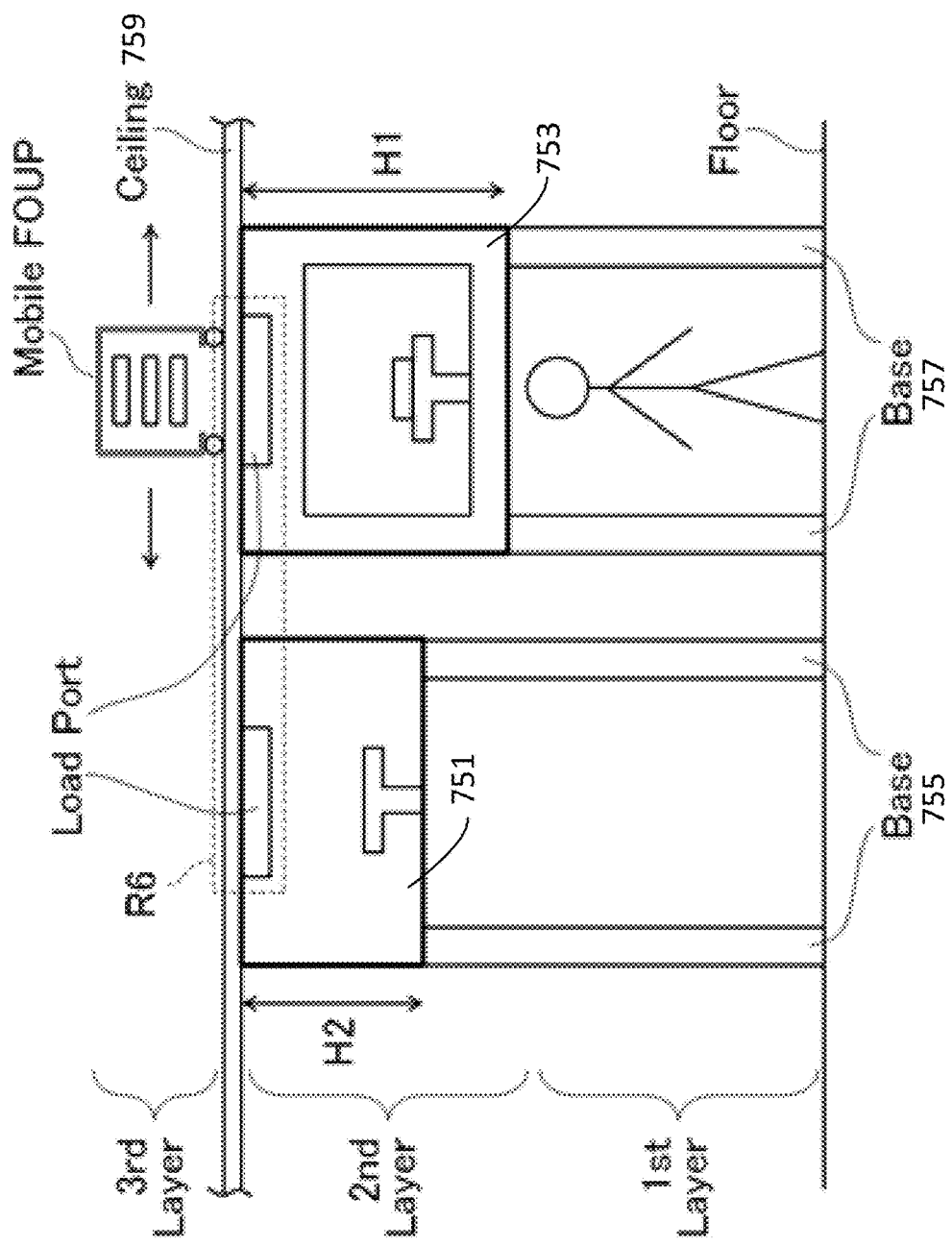
FIG. 7 shows an example of multiple semiconductor processing tools having load ports along a wafer transport surface.

The system of FIG. 7 has a three-layer structure, in which a 1st layer (lowest layer—extending to floor level) provides for human access (personnel access level), a 2nd layer (middle layer—extending from the first layer to the ceiling) includes locations for the semiconductor processing equipment (equipment level), and a 3rd layer (highest layer—above the ceiling) provides for FOUP (or other substrate transport pod) transfer.

The semiconductor processing equipment tools 751, 753 are arranged on separate bases 755, 757 in FIG. 7. Thereby the semiconductor equipment can be placed above the floor as shown. A height of the base is adjusted such that heights of upper surfaces of the respective semiconductor equipment 751, 753 become level with each other along a common plane. In particular, the heights of load ports of different equipment may be brought to the same plane, at or near the ceiling 759, which also serves as the wafer transport surface, to facilitate direct transfer from mobile pods on the wafer transport surface to such equipment. This may require different pieces of equipment to be elevated to different levels from the floor. Equipment maintenance can generally be performed by people entering into the space under the semiconductor equipment (1$^{st}$ layer). In some cases, equipment may be lowered from its operational location for some or all maintenance (i.e. a particular piece of equipment may be lowered to a convenient level to allow access from the side and/or top in addition to bottom access). In this way, closely spaced equipment that is not accessible in its operational location may be lowered to a more accessible position for maintenance. Thus, while the equipment is generally in the second layer (equipment layer) when in use for processing wafers (as shown in FIG. 7), it may be lowered to the 1$^{st}$ layer for maintenance. Additional levels or layers (not shown) may also be provided, for example, a sub-fab under the 1$^{st}$ layer may be used for ancillary equipment including pumps, power supplies, exhaust scrubbers, etc. and an air handling level above the 3$^{rd}$ layer may include HEPA filters, and fans.

The arrangement of FIG. 7 provides several advantages including the following:

(1) Even if heights H1 and H2 of the respective semiconductor equipment are different, it is possible to locate all the load port locations on a common plane (see region R6) so that they are aligned with the substrate transport surface of ceiling 759 to allow easy transfer of wafers.

(2) Personnel access can be provided (e.g. a system of passages) under the equipment in the 1$^{st}$ layer. A passage for people between respective equipment, which has generally been necessary for transport and equipment access, can be omitted. Thus, instead of providing human access on the same level as the equipment, here human access is provided under the equipment so that the equipment may be closely spaced. Rather than spacing equipment laterally to allow human passage between equipment, equipment may be spaced according to machine requirements (e.g. some minimum spacing to allow cooling, reduce vibration or other interaction). In some cases, equipment may be in contact, or nearly in contact with adjacent equipment. It is possible to make the utmost use of the space within the clean room.

4. Single-Wafer Transfer Space

Figure 8A:
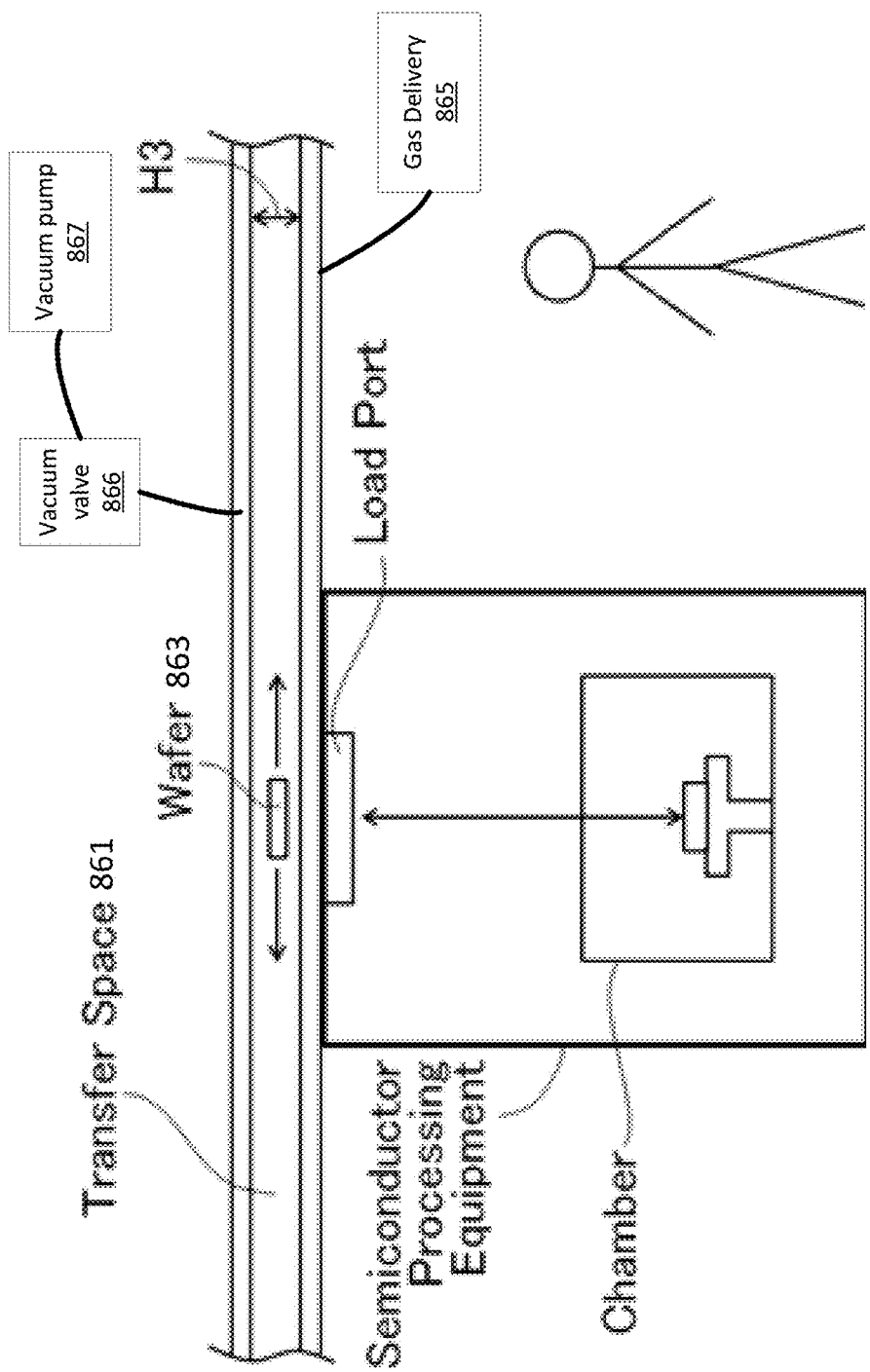
FIG. 8A shows an example of a cross section of a wafer transport conduit.

An example of a transfer space or conduit 861 for transferring wafers sheet-by-sheet (substrate-by-substrate, or one wafer at a time) is provided on the ceiling in FIG. 8A. A wafer 863 may be transferred within the transfer space 861 by floating the wafer by supplying gas through the transfer space (e.g. by supplying jets of gas through small openings in a bottom surface of the conduit 861 to create an upward force on wafer 863 that allows the wafer to be suspended without physical contact). A gas delivery system 865 may control gas pressure and flow through openings so that the upward force from the jets on the bottom of a wafer is equal to the weight of the wafer. By using an inert gas (e.g. nitrogen, $N_2$ gas) gas delivery system can purge the interior of the conduit with inert gas while suspending the wafer. Conduit 861 may be substantially enclosed and thus isolated from contamination in surrounding air. Contamination of the wafers can thus be reduced or prevented. It should be noted that height H3 of the interior of the conduit 861 can be made very small, so as to have a height that is sufficient for one wafer with little extra space to allow for frictionless and contactless transfer (i.e. H3 may be little more than the thickness of the substrate). The volume of the interior of conduit 861 can thus be minimized which facilitates purging of the conduit.

Moreover, if the semiconductor processing equipment, to which wafers are transferred, includes a vacuum chamber, the transfer space, or a portion of the transfer space, can be decompressed or pumped down. For example, a portion of a conduit may be isolated by one or more gates or gate valves and attached to a suitable vacuum source such as a vacuum pump (e.g. vacuum pump 867 of FIG. 8A) through a vacuum valve (e.g. vacuum valve 866 of FIG. 8A) and may be reduced to a suitable vacuum level. Gas jets in the portion of the conduit may be switched off during such a pump down and the wafer may sit on a pedestal, pins, or other suitable hardware. This configuration can let the transfer space, or a portion thereof, serve a role of a load-lock chamber for locking the vacuum chamber from the outside air. In some cases, the entire transfer space, or a substantial portion of the transfer space may be maintained below atmospheric pressure (e.g. by connecting to one or more vacuum pumps) and substrates may be moved mechanically with some physical contact with wafers while under vacuum. A suitable mechanical structure for moving substrates under vacuum may use rollers, or balls, arranged along a lower surface of the transfer space. Rotation of such rollers or balls may be controlled independently so that substrates may be moved laterally in any direction in the transfer space. Control of the rotation of such balls or rollers may use magnetic force.

Figure 8B:
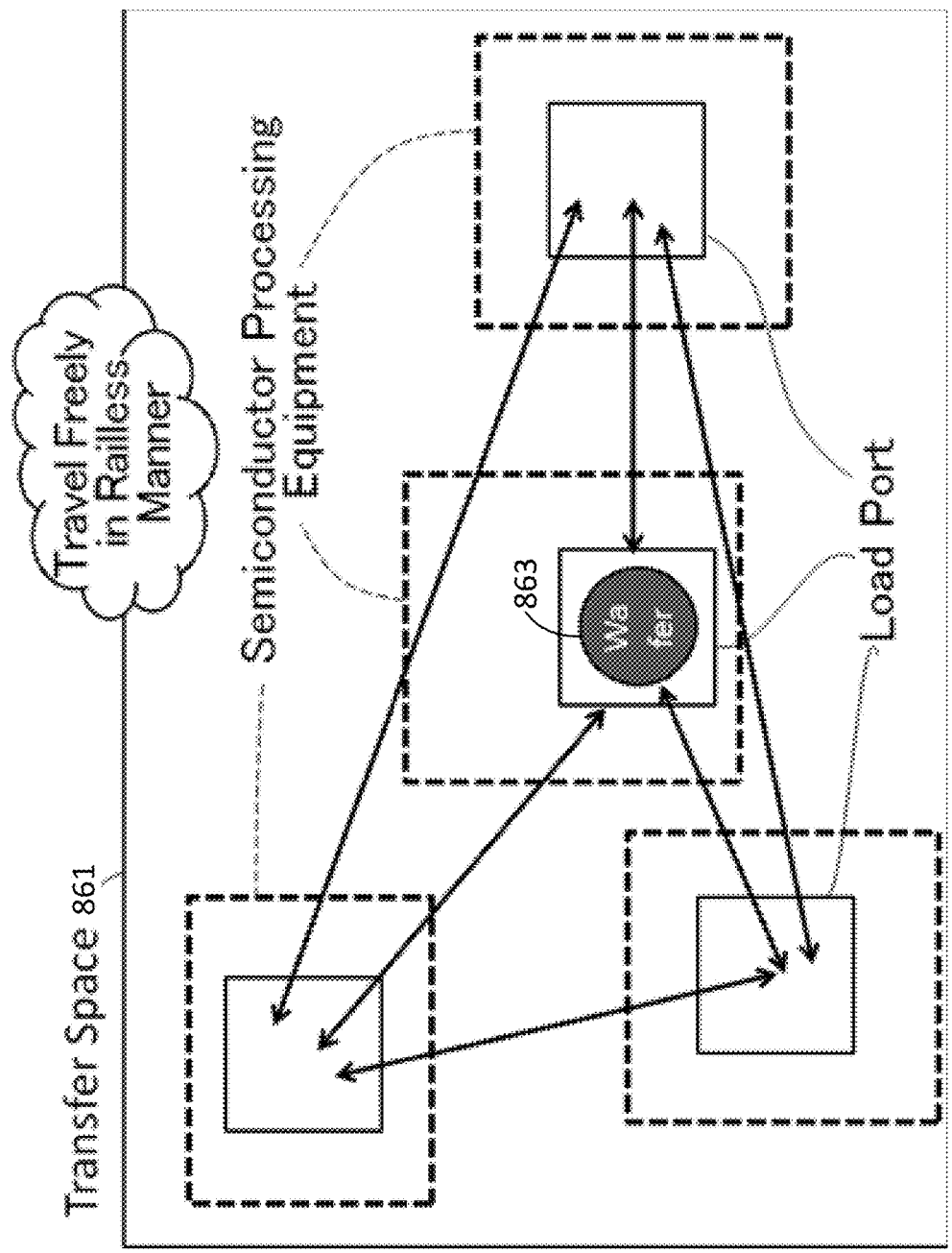
FIG. 8B shows a plan view of a wafer transport conduit.

FIG. 8B shows a top-down view of the transfer space of FIG. 8A. The transfer space 861 may be a flat, planar, or substantially planar space, and may extend over multiple pieces of semiconductor processing equipment as shown. Wafers are not constrained by rails so that they can travel between load ports freely along a variety of different pathways. Such unconstrained transport has significant advantages for wafers as for FOUPs (discussed above). A central controller may control movement of all wafers within such a transfer space so that wafers do not collide with each other, or with other obstructions. The central controller may control a gas delivery system so that gas jets keep wafers moving appropriately.

The arrangement of FIGS. 8A-B has various advantages including the following:

Wafer loading/unloading to/from a FOUP can be omitted. Because no FOUP or other pod is required, this equipment is eliminated (pod-less transport) and substrates are directly transferred to the load port which may shorten transfer times significantly, may reduce capital cost (no pods are needed and loading/unloading hardware is simplified), reduce equipment footprint (and thus cost) and may reduce particle contamination by purging with inert gas and reducing particle generation from mechanisms such as FOUPS and loaders.

5. Additional Variations

Figure 9:
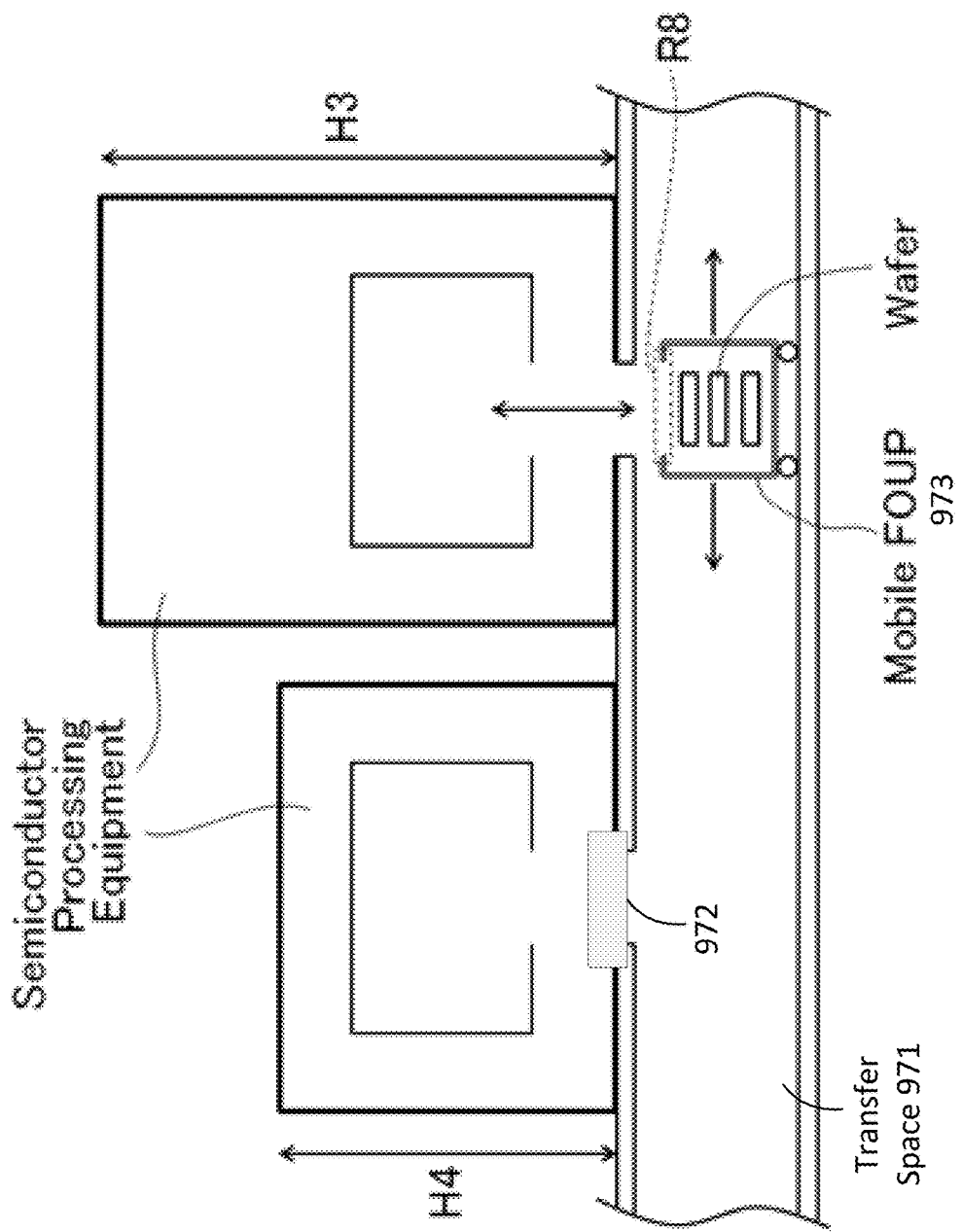
FIG. 9 shows a wafer transport conduit extending under semiconductor processing tools.

A transfer space or conduit 971 may be formed under the floor of a fab or other facility as shown in FIG. 9. Load ports (e.g. load port 972) are arranged on a bottom part of the semiconductor processing equipment. A mobile FOUP 973 is made to move in a rail-less manner in the transfer space 971. An opening for wafer loading/unloading can be formed at a top part of the FOUP 973 (region R8).

The mobile FOUP 973 can interface with a load port by the mobile FOUP 973 simply stopping under a load port on the bottom part of the equipment.

Even when equipment heights H3 and H4 are different, locations of the load ports on the bottom parts thereof can all be located on a same plane.

A pod-less transport conduit may also be located below an equipment layer. For example, a conduit like the conduit of FIG. 8A may extend under the equipment level as shown in FIG. 9 instead of extending over the equipment level as shown in FIG. 8A. This may allow a wafer at a load/unload location to be loaded into a semiconductor processing tool by manipulating gas flow and vacuum supply in the conduit and the interior of the tool. Alternatively, pins or other moving parts may elevate wafers into a tool.

Figure 10:
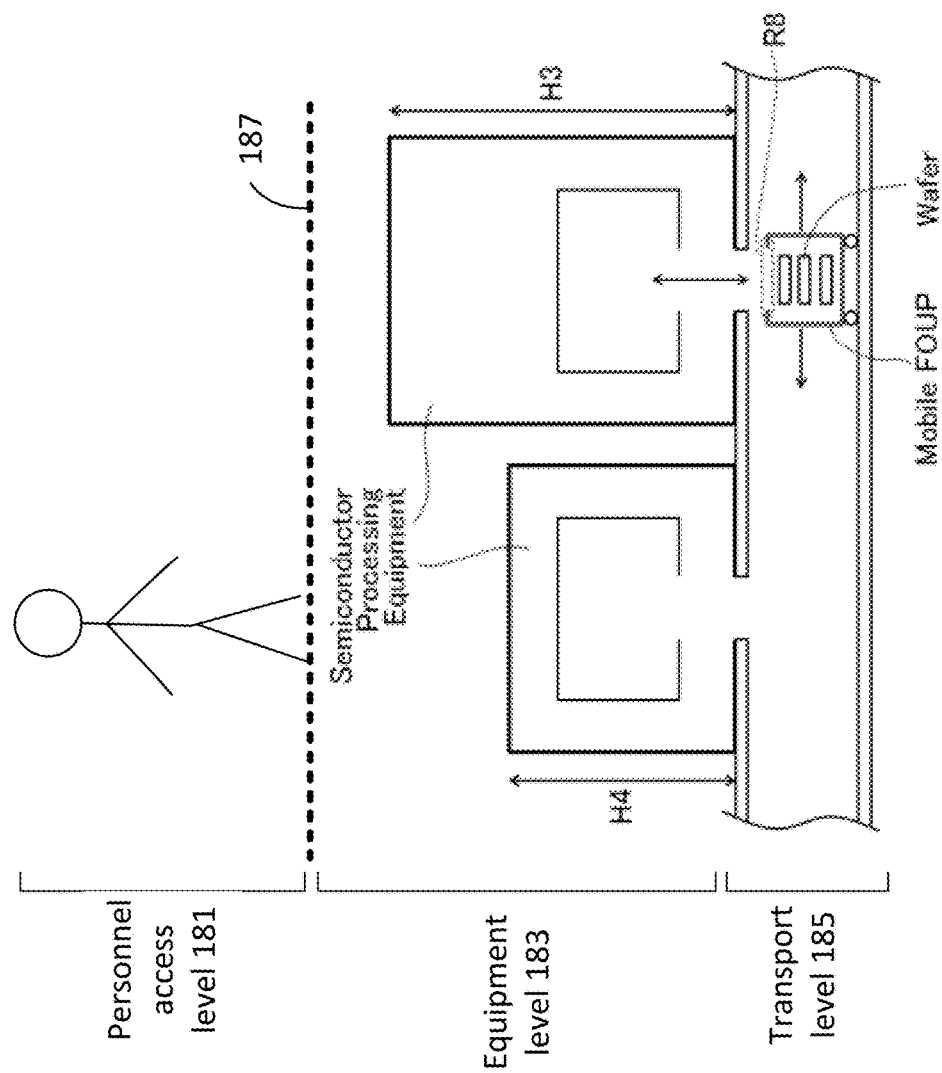
FIG. 10 shows a personnel access level extending over an equipment level.

FIG. 10 shows a personnel access level 181 extending over an equipment level 183 with a transport level 185 extending under the equipment level. In this case, equipment can be accessed from above, or equipment may be raised from the equipment level 183 to the personnel access level 181 to facilitate access during maintenance. A floor 187 may include removable sections to allow access, or some walkways may extend along locations to provide personnel access from above.

CONCLUSION

Although the various aspects have been described with respect to examples, it will be understood that protection within the full scope of the appended claims is appropriate.

It is claimed:

1. A semiconductor substrate transport system comprising:
a substrate transport conduit that extends along a horizontal plane located above a plurality of processing tools, each processing tool having a load port located below the horizontal plane and having one or more chambers located below the load port, the substrate transport conduit providing a plurality of different pathways between the load ports of the plurality of processing tools, the substrate transport conduit having a conduit floor;
a gas delivery system that forms a plurality of jets of gas extending up from the conduit floor, the plurality of jets configured to provide an upward force on a semiconductor substrate within the substrate transport conduit that is equal to weight of the semiconductor substrate and thereby float the semiconductor substrate above the conduit floor without physically contacting the conduit floor; and
a substantially vertical pathway that enables substantially vertical transfer of the semiconductor substrate from the substrate transport conduit through the load port of a processing tool of the plurality of tools, to a chamber in the processing tool.

2. The semiconductor substrate transport system of claim 1 wherein the gas delivery system forms the plurality of jets of gas from an inert gas that is supplied at a pressure substantially above atmospheric pressure.

3. The semiconductor substrate transport system of claim 2 wherein the substrate conduit is substantially enclosed so that an interior space within the conduit is isolated from ambient air and contamination.

4. The semiconductor substrate transport system of claim 3 further comprising a vacuum valve that selectively connects the interior space, or a portion of the interior space, to a vacuum source to thereby selectively create a vacuum within the substrate transport conduit.

5. The semiconductor substrate transport system of claim 4 wherein the vacuum valve connects a portion of the interior space at a first load/unload location to the vacuum source to selectively form a vacuum at the first load/unload location during loading and unloading of a semiconductor substrate.

6. The semiconductor substrate transport system of claim 1 further comprising a controller configured to control movement of a plurality of substrates within the substrate transport conduit to reroute substrates from a stopped or slowed processing tool of the plurality of processing tools to another processing tool of the plurality of processing tools.

7. The semiconductor substrate transport system of claim 1 wherein a portion of the transport conduit is maintained below atmospheric pressure, the portion of the transport conduit having a mechanical structure for moving substrates under vacuum.

8. A semiconductor substrate transport system comprising:
a substrate transport conduit that extends along a horizontal plane located above a plurality of processing tools, each processing tool having a load port located below the horizontal plane and having one or more chambers located below the load port, the substrate transport conduit providing a plurality of different pathways between the load ports of the plurality of processing tools, the substrate transport conduit having a conduit floor, a portion of the transport conduit is maintained below atmospheric pressure, the portion of the transport conduit having rollers or balls arranged along the conduit floor for lateral movement of substrates in the portion of the transport conduit;
a gas delivery system that forms a plurality of jets of gas extending up from the conduit floor, the plurality of jets configured to provide an upward force on a semiconductor substrate within the substrate transport conduit that is equal to weight of the semiconductor substrate and thereby float the semiconductor substrate above the conduit floor without physically contacting the conduit floor; and
a substantially vertical pathway that enables substantially vertical transfer of the semiconductor substrate from the substrate transport conduit through the load port of a processing tool of the plurality of tools, to a chamber in the processing tool.

9. The semiconductor substrate transport system of claim 8 wherein rotation of the rollers or balls is controlled independently so that substrates may be moved laterally in any direction.

10. The semiconductor substrate transport system of claim 8 wherein magnetic force is used to control rotation of the rollers or balls.

11. The semiconductor substrate transport system of claim 8 further comprising one or more gates to isolate the portion of the transport conduit while maintained below atmospheric pressure.

12. The semiconductor substrate transport system of claim 11 further comprising a vacuum pump and vacuum valve to reduce pressure in the portion of the transport conduit.

13. The semiconductor substrate transport system of claim 8 wherein the gas delivery system forms the plurality of jets of gas from an inert gas that is supplied at a pressure substantially above atmospheric pressure.

14. The semiconductor substrate transport system of claim 13 wherein the substrate conduit is substantially enclosed so that an interior space within the conduit is isolated from ambient air and contamination.

15. The semiconductor substrate transport system of claim 8 further comprising a controller configured to control movement of a plurality of substrates within the substrate transport conduit to reroute substrates from a stopped or slowed processing tool of the plurality of processing tools to another processing tool of the plurality of processing tools.

16. A method of transporting semiconductor substrates comprising:
   transporting a plurality of semiconductor substrates horizontally through a substrate transport conduit that extends along a horizontal plane located above a plurality of processing tools, each processing tool having a load port located below the horizontal plane and having one or more chambers located below the load port, the substrate transport conduit providing a plurality of different pathways between the load ports of the plurality of processing tools;
   providing a plurality of jets of gas from a conduit floor to provide an upward force on each of the plurality of semiconductor substrates within the substrate transport conduit that is equal to the weight of a semiconductor substrate to thereby float the plurality of semiconductor substrates above the conduit floor; and
   vertically transferring a semiconductor substrate of the plurality of semiconductor substrates from the substrate transport conduit down through the load port of a processing tool of the plurality of processing tools to a chamber in the processing tool, the chamber located below the load port.

17. The method of claim 16 further comprising pumping down a portion of the substrate transport conduit containing the semiconductor substrate prior to vertically transferring the semiconductor substrate from the substrate transport conduit through the load port.

18. The method of claim 17 wherein pumping down the portion of the substrate transport conduit includes closing one or more gates, turning off gas jets in the portion of the substrate transport conduit, and coupling a vacuum pump to the portion of the substrate transport conduit through a vacuum valve.

19. The method of claim 16 wherein a portion of the substrate transport conduit is maintained below atmospheric pressure and semiconductor substrates in the portion of the substrate transport conduit are moved mechanically.

20. The method of claim 19 wherein the semiconductor substrates are moved mechanically by controlled rotation of rollers or balls using magnetic force.

* * * * *